(12) United States Patent
Kwon et al.

(10) Patent No.: US 6,818,998 B2
(45) Date of Patent: Nov. 16, 2004

(54) STACKED CHIP PACKAGE HAVING UPPER CHIP PROVIDED WITH TRENCHES AND METHOD OF MANUFACTURING THE SAME

(75) Inventors: Yong Hwan Kwon, Suwon (KR); Se Yong Oh, Seoul (KR); Sa Yoon Kang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/157,272

(22) Filed: May 28, 2002

(65) Prior Publication Data

US 2003/0001281 A1 Jan. 2, 2003

(30) Foreign Application Priority Data

Jun. 29, 2001 (KR) .................................... 2001-0038103

(51) Int. Cl.[7] .......................... H01L 23/34; H01L 29/40; H01L 23/02
(52) U.S. Cl. ........................ 257/777; 257/784; 257/723; 257/686
(58) Field of Search .................... 257/777, 723; 1/686

(56) References Cited

U.S. PATENT DOCUMENTS

| 4,622,574 A | * | 11/1986 | Garcia | 257/627 |
| 4,670,770 A | * | 6/1987 | Tai | 257/777 |
| 4,939,619 A | * | 7/1990 | Borkowicz et al. | 361/117 |
| 5,557,148 A | * | 9/1996 | Cain | 257/777 |
| 6,049,124 A | * | 4/2000 | Raiser et al. | 257/712 |
| 6,157,077 A | * | 12/2000 | Matsuoka et al. | 257/706 |
| 6,583,512 B2 | * | 6/2003 | Nakaoka et al. | 257/777 |
| 6,700,178 B2 | * | 3/2004 | Chen et al. | 257/618 |
| 2002/0004288 A1 | * | 1/2002 | Nishiyama | 438/464 |
| 2003/0111720 A1 | * | 6/2003 | Tan et al. | 257/686 |
| 2003/0127722 A1 | * | 7/2003 | Nakaoka et al. | 257/686 |

FOREIGN PATENT DOCUMENTS

| JP | 2000049279 A | | 2/2000 |
| JP | 2000049279 | * | 2/2000 |
| KR | 2000-0061035 | | 10/2000 |

* cited by examiner

Primary Examiner—Luan Thai
Assistant Examiner—James M. Mitchell
(74) Attorney, Agent, or Firm—Harness Dickey (57) ABSTRACT

A stacked chip package includes a substrate having an upper surface and a lower surface, a first semiconductor chip having an upper surface and a lower surface, wherein the lower surface of the first semiconductor chip is attached to the upper surface of the substrate and the upper surface of the first semiconductor chip includes a plurality of first electrode pads, and a second semiconductor chip having an upper surface and a lower surface. The lower surface of the second semiconductor chip is attached to the upper surface of the first semiconductor chip, and the lower surface of the second semiconductor chip includes trenches that correspond to the locations of the first electrode pads on the upper surface of the first semiconductor chip.

12 Claims, 8 Drawing Sheets

STACKED CHIP PACKAGE HAVING UPPER CHIP PROVIDED WITH TRENCHES AND METHOD OF MANUFACTURING THE SAME

BACKGROUND

1. Field of the Invention

The present invention relates to stacked chip packaging technology. More particularly, the present invention relates to a stacked chip package that includes an upper chip having trenches and a method of manufacturing the same.

2. Description of the Related Art

As more circuitry is integrated into high performance semiconductor chips, the size of such chips increases and the need for a greater density of chips is needed. Stacked chip packages and stacked packages have been developed to meet this need. Stacked chip packages include multiple chips stacked on one another and embodied in a single package. In contrast, stacked packages includes multiple packages, where each package includes a single chip, stacked on one another. Stacked chip packages and stacked packages have the advantage that chips having several functions can be embodied in a single package.

In a stacked package, the thickness of an individual package is at least two times that of the chip embodied within the package. Thus as individual packages are stacked to form a stacked package, the thickness of the resulting stacked package is very thick which is undesirable. Also, to electrically connect the individual packages, the leads which extend from each package must be deformed. This requires additional steps to be performed when fabricating a stacked package which can decrease yield. Such steps can include fitting the external lead of the individual package disposed in the upper portion into the external lead of the individual package disposed in the lower portion, and punching in the external lead of the individual stacked package perpendicularly, and inserting a connecting terminal in the hole or other suitable deformation. Since an external connection terminal must be used in a stacked package, a decrease of the yield of the such packages is inevitable.

When compared to stacked packages, stacked chip package are more advantageous since they can be mounted more easily and effectively. Additionally, stacked chip packages can be designed using different types of internal structures.

For example, one conventional stacked chip package includes a lower chip which is attached to a lower surface of a lead frame die pad via an adhesive, and an upper chip which is attached to the upper surface of the die pad via an adhesive. The lower chip is attached to the die pad such that the active surface of the lower chip faces downward, and the upper chip is attached to the die pad such that the active surface of the upper chip faces upward. The upper and lower semiconductor chips respectively are electrically connected to a lead frame via bonding wires. The upper and lower chips and the bonding wires are encapsulated and protected by a package body formed by a mold resin. In this type of conventional stacked chip package, the lower chip and the upper chip can have the same size and be identical to one another. For example, the upper and lower chips can both be edge pad chips, on which electrode pads connected to the bonding wires are formed in the edge portion of the active surface of the chip.

Another conventional stacked chip package is configured to stack a plurality of chips on a die pad in the same direction. In such a case, a lower chip must be larger than an upper chip. The lower chip is attached to the die pad via an adhesive and the upper chip is attached to the active surface of the lower chip via an adhesive. The upper and lower chips are electrically connected to leads via bonding wires, and are protected by a package molding body. In the stacked package having the above-described structure, the structures of the upper and lower chips must be different from each other (i.e., the lower chip must be larger than the upper chip).

SUMMARY

In one embodiment of the present invention, a stacked chip package is provided. The stacked chip package includes a substrate having an upper surface and a lower surface, a first semiconductor chip having an upper surface and a lower surface, wherein the lower surface of the first semiconductor chip is attached to the upper surface of the substrate and the upper surface of the first semiconductor chip includes a plurality of first electrode pads, and a second semiconductor chip having an upper surface and a lower surface, wherein the lower surface of the second semiconductor chip is attached to the upper surface of the first semiconductor chip and the lower surface of the second semiconductor chip includes trenches that correspond to the locations of the first electrode pads on the upper surface of the first semiconductor chip.

Other embodiments, aspects, and advantages of the present invention will become apparent from the following descriptions and the accompanying drawings.

BRIEF DESCRIPTION OF THE DRAWINGS

For a more complete understanding of the present invention and for further embodiments, aspects, and advantages, reference is now made to the following description taken in conjunction with the accompanying drawings in which.

DETAILED DESCRIPTION

Figure 1:
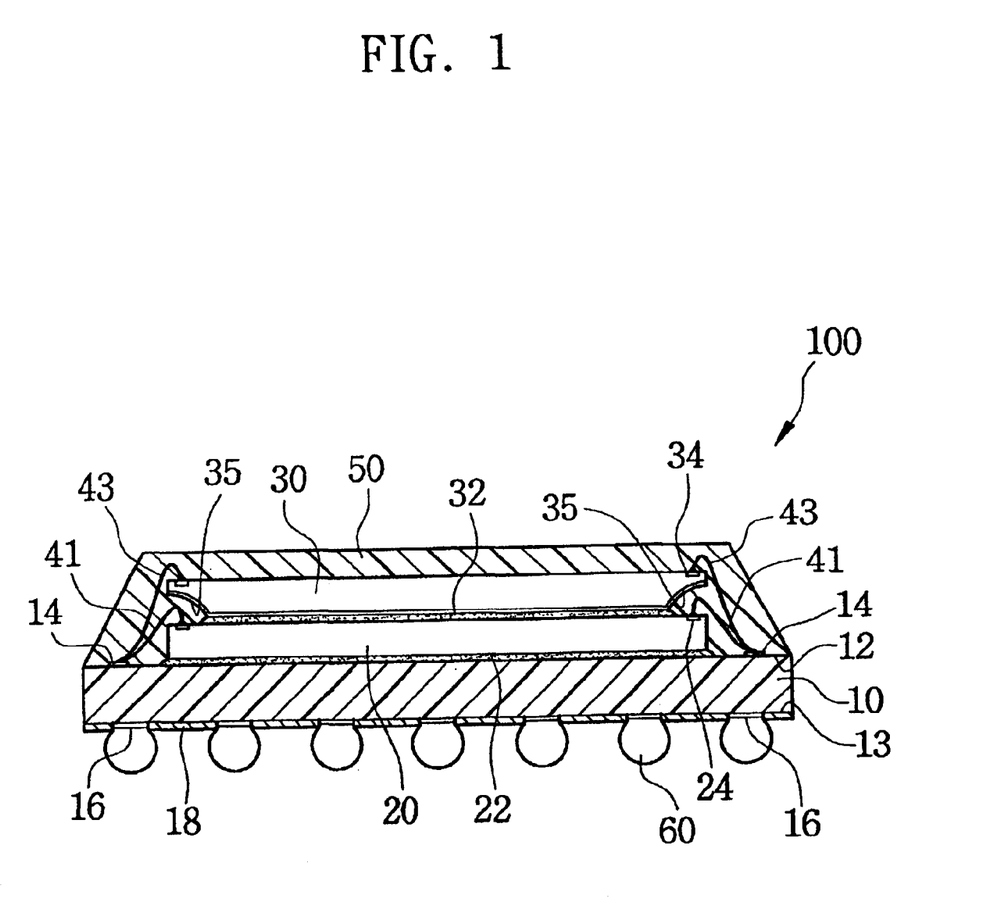
FIG. 1 is a cross-sectional side view of a stacked chip package according to an embodiment of the present invention.

FIG. 1 is a cross-sectional side view of a stacked chip package 100 according to an embodiment of the present invention. The stacked chip package 100 comprises a substrate 10, a plurality of semiconductor chips 20 and 30 and a package molding body 50.

The substrate 10 may be any suitable substrate material such as a polyimide tape, a printed circuit board (PCB), or a ceramic board. The substrate 10 has a mounting surface 12, on which semiconductor chips are mounted, and a lower surface 13 opposite to the mounting surface 12. A plurality of bonding pads 14 are formed in the mounting surface 12 of the substrate 10. The lower semiconductor chip 20 is attached to the mounting surface 12 of the substrate 10 via a first adhesive layer 22. An on-chip circuit and a plurality of electrode pads 24 are formed in the active surface of the lower semiconductor chip 20, that is, the upper surface of the chip 20 in the FIG. 1. The cross-section of the lower semiconductor chip 20 has a rectangular shape.

The upper semiconductor chip 30 is attached to the active surface of the lower semiconductor chip 20 via a second adhesive layer 32. The first adhesive layer 22 and the second adhesive layer 32 can be any suitable adhesive, such as an Ag-epoxy adhesive or a film type adhesive tape made of an epoxy-based resin. An on-chip circuit and a plurality of electrode pads 34 are also formed in the active surface of the upper semiconductor chip 30. The size and the arrangement of the on-chip circuit and the electrode pads of the upper semiconductor chip 30 is similar to the arrangement of the on-chip circuit and the electrode pads of the of the lower semiconductor chip 20. The lower and upper semiconductor chips 20 and 30 are edge pad chips, in which the electrode pads 24 and 34 are disposed on the edges of the active surfaces of the chips.

Unlike the cross-section of the lower semiconductor chip 20, the cross-section of the upper semiconductor chip 30 does not have a rectangular shape. Rather, in both edges of the lower surface of the upper semiconductor chip 30, trenches 35 of a substantially semicircular shape are formed.

The electrode pads 24 of the lower semiconductor chip 20 are electrically connected to the bonding pads 14 of the substrate 10 via first bonding wires 41. The electrode pads 34 of the upper semiconductor chip 30 are electrically connected to the bonding pads 14 of the substrate 10 via second bonding wires 43. From the bonding wires 41 and 43, balls (not shown) are formed on the electrode pads 24 and 34, and stitches are formed on the bonding pads 14 of the substrate 10. A wire loop of a certain height is provided above the balls formed on the electrode pad 24 and 34.

According to the present invention, trenches 35 are formed in both edges of the lower surface of the upper semiconductor chip 30. The trenches 35 provide a necessary space for the wire loop of the first bonding wires 41 that connect to the lower semiconductor chip 20. By providing the trenches 35 in upper semiconductor chip 30, it is possible to stack chips 30 and 20, which can perform identical functions and can have identical physical sizes, in the same direction on the substrate 10.

Because the chips are stacked on only one surface (i.e., mounting surface 12) of the substrate 10, the lower surface of the substrate 10 can be utilized as a space for electrically connecting the stacked chip package 100 to an external device, such as a motherboard. In particular, a plurality of ball lands 16 can be formed on the lower surface 13 of the substrate 10. Solder resist 18 can be applied around the ball lands 16. Next, solder balls 60 can be arranged on the ball lands 16 and reflowed so that an external electrical connection can be formed using a surface arrangement technique. Since the ball lands 16 are electrically connected to bonding pads 14 through the substrate 10, the upper and lower semiconductor chips 20 and 30 can be electrically connected to an external device, such as a motherboard through the electrode pads 24 and 34, the bonding wires 41 and 43, the bonding pads 14, the ball lands 16, and the solder balls 60.

Figure 2:
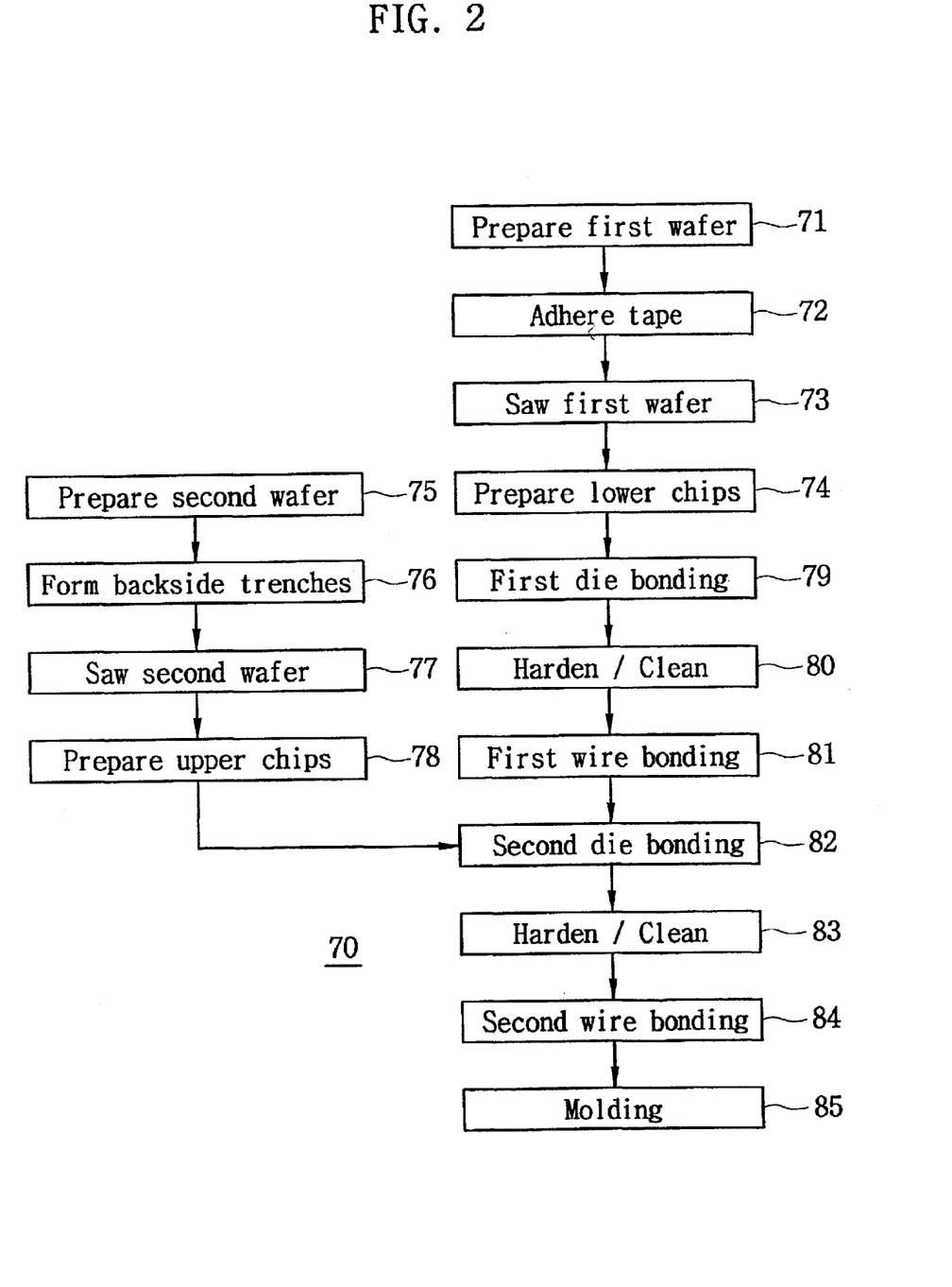
FIG. 2 is a flow chart showing a method of manufacturing a stacked chip package according to the present invention.

FIG. 2 is a flow chart showing a method of manufacturing a stacked chip package, such as stacked chip package 100, according to an embodiment of the present invention.

First, a first wafer to be formed into a plurality of lower chips (e.g., chip 20) is prepared (step 71). The first wafer is fabricated to have an on-chip circuit and electrode pads using a wafer-batch fabrication process. Tape is affixed to the lower surface of the first wafer (step 72) and then the first wafer is sawed using a cutting blade (e.g., a diamond wheel) rotating at a high speed (step 73). The wafer is sawed along a scribe line formed in the upper surface (i.e., the active surface) of the wafer. By separating the individual semiconductor chips from the sawed wafer, the lower semiconductor chips are prepared (step 74).

Next, a second wafer to be formed into a plurality of upper chips (e.g., chip 30) is prepared (step 75). The second wafer is fabricated to have an on-chip circuit and electrode pads that are similar to or identical to the on-chip circuit and electrode pads of the first wafer using the wafer-batch fabrication process. A plurality of backside trenches are formed in the lower surface of the second wafer (step 76) and then the second wafer is sawed (step 77). By separating the individual semiconductor chips from the sawed wafer, the upper chips are prepared (step 78). The step of forming the backside trenches is described in detail below with reference to FIGS. 3a through 5f.

The prepared lower semiconductor chips are attached to the substrate using a first die bonding step 79. Then the adhesive layer used in the die bonding step is hardened and thereafter the surface of the adhesive layer is cleaned by, for example, a plasma (step 80). The die bonded lower semiconductor chip is electrically connected to the substrate using a first wire-bonding step 81.

Next, the upper semiconductor chips are attached to the active surfaces of the lower semiconductor chips using a second die bonding step 82. Then the adhesive layer is hardened and thereafter the surface of the adhesive layer is cleaned by the plasma (step 83). The upper semiconductor chip is electrically connected to the substrate using a second wire-bonding step 84. Finally, a package body is formed after a molding step 85.

The step of forming the backside trenches in the second wafer (step 76) can be carried out by various methods as described below.

FIGS. 3a to 3e are cross-sectional side views used to explain a first exemplary method of manufacturing the upper semiconductor chip having backside trenches according to the present invention.

Figure 3A:
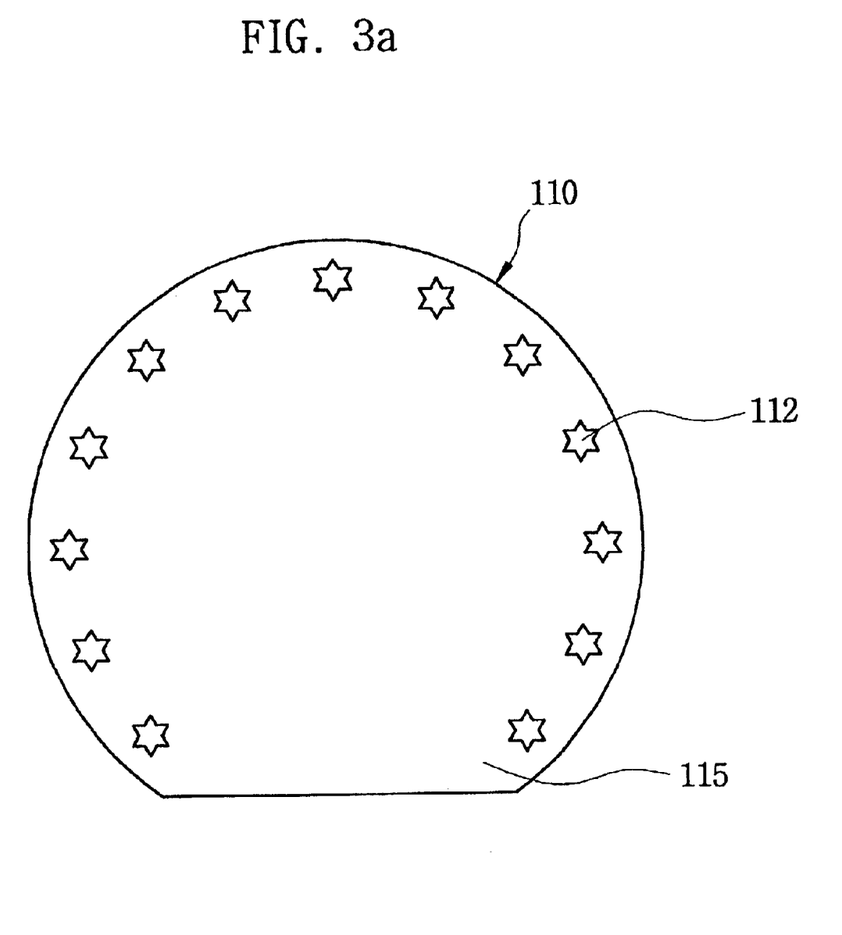
FIGS. 3a to 3c are used to explain a first method of manufacturing an upper semiconductor chip in a stacked chip package according to the present invention.

As shown in the plan view of FIG. 3a, the wafer 110, in which the plurality of semiconductor chips are formed using the wafer fabrication process, is prepared and alignment keys 112 are formed on the backside 115 of the wafer 110, that is, the surface of the wafer that is opposite to active surface.

Figure 3B:
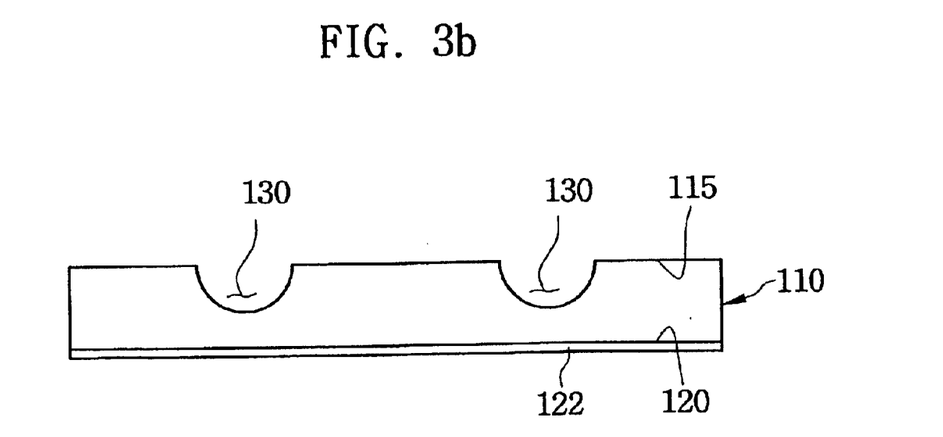

As shown in the cross-sectional side view of FIG. 3b, groves or trenches 130 of predetermined depths and widths are formed on the backside 115 of the wafer 110. The locations of the trenches 130 are determined based on the alignment keys 112 and correspond to the locations of scribe line on the active surface of the wafer 110. A passivation layer 122 is deposited on the active surface 120 of the wafer 110. The trenches 130 are formed by sawing the wafer, for example, using a cutting blade rotating at a high speed. The depths and widths of the trenches 130, as explained referring to FIG. 1, are large enough such that there is sufficient space for the wire loop which extends above the electrode pads of the lower chips in the stacked chip package.

Figure 3C:
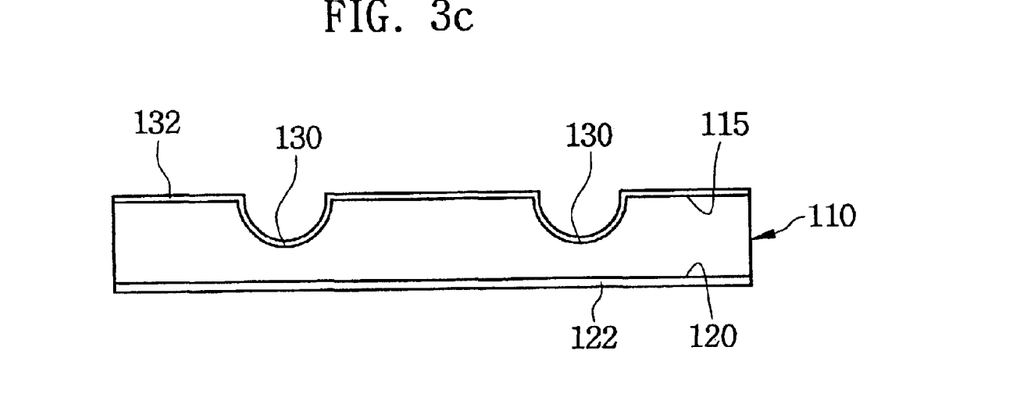
Figure 3D:
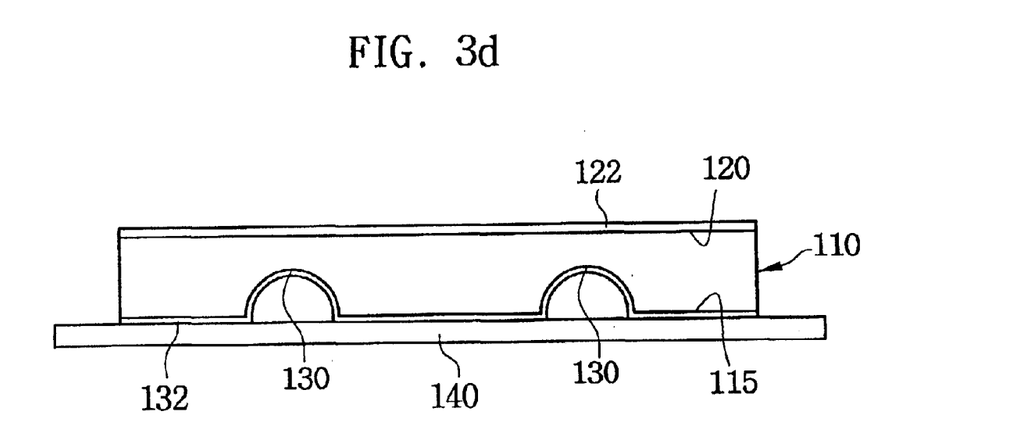
Figure 3E:
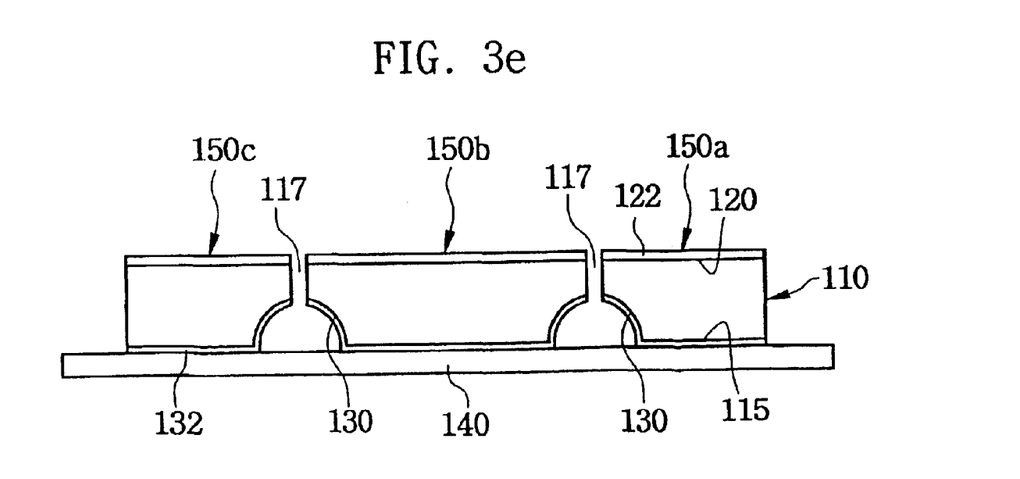

In FIG. 3c, a metal layer 132 is deposited on the entire surface of the backside 115 of the wafer 110 including the surface of the trenches 130. The metal layer 132 prevents the wafer 110 from breaking or generating chip cracks in the process of applying the adhesive to the backside 115 of the wafer and sawing the active surface of the wafer along the scribe line, thereby separating the individual chips from the wafer. In other words, the metal layer 132 increases the mechanical strength of the wafer having trenches 130. The metal layer 132 can be deposited on the entire surface of the backside 115 of the wafer using any suitable technique, such as by electroplating, sputtering, evaporation, or electroless plating.

After an adhesive tape 140 is attached to the backside 115 of the wafer 110, in which the trenches 130 are formed and the metal layer 132 is deposited thereon (FIG. 3d), the wafer 110 is sawed along the scribe line so that the wafer 110 is separated into the individual chips 150a, 150b and 150c. The wafer 110 can be separated into the individual chips 150a, 150b and 150c using the general wafer sawing process. Although the individual chips are separated by separation regions 117, the lower surfaces thereof remain fixed to the adhesive tape 140.

FIGS. 4a to 4e are cross-sectional side views used to explain a second exemplary method of manufacturing the upper semiconductor chip having backside trenches according to the present invention.

Figure 4A:
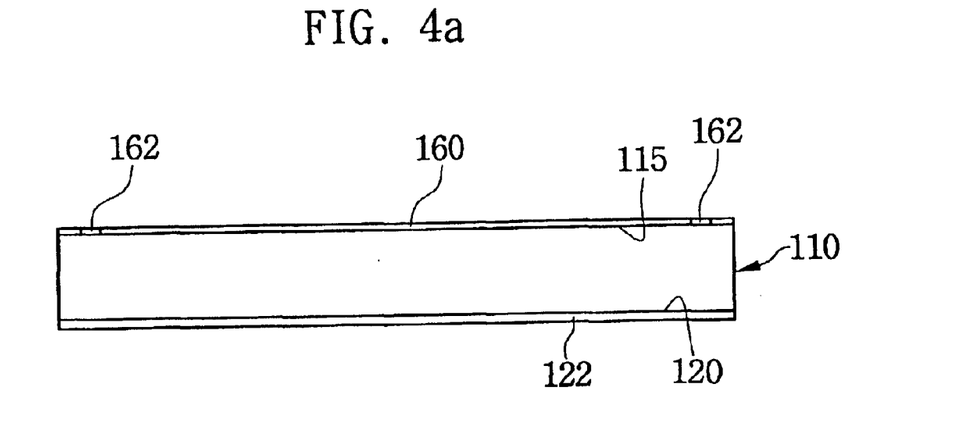
FIGS. 4a to 4e are used to explain a second method of manufacturing an upper semiconductor chip in a stacked chip package according to the present invention.
Figure 4B:
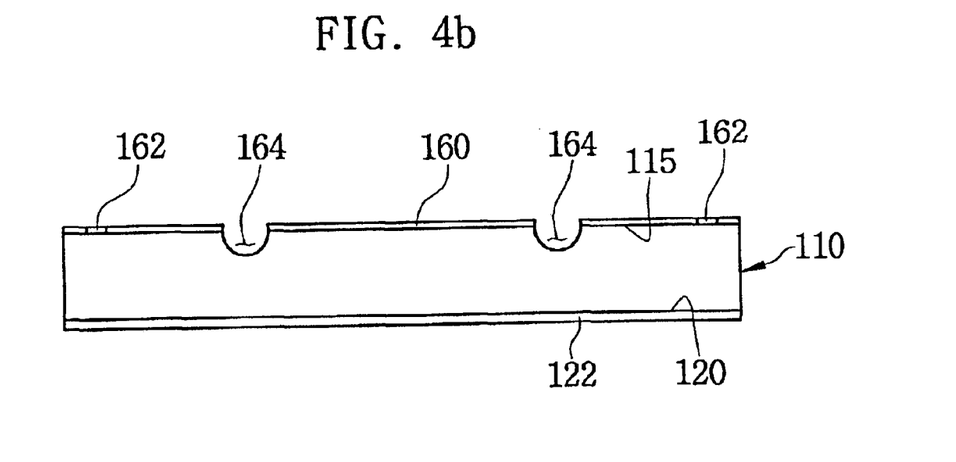
Figure 4C:
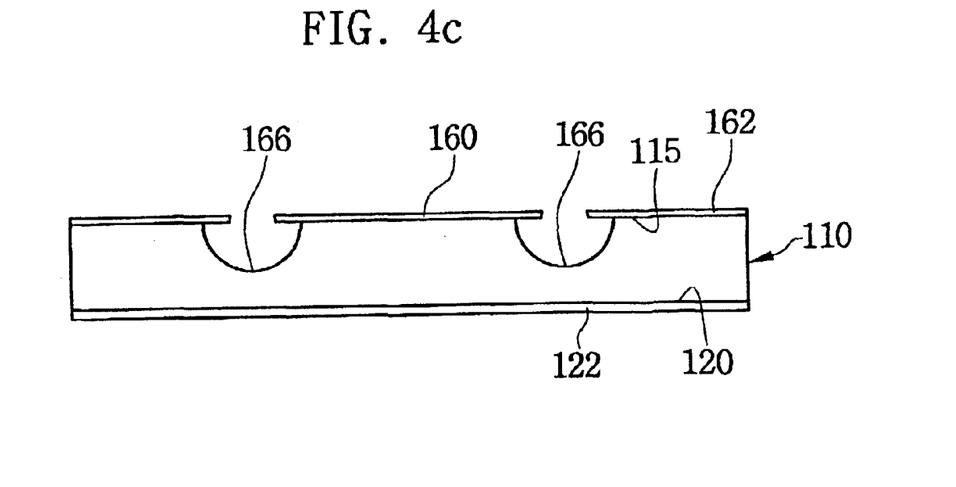

Referring to FIG. 4a, alignment keys 162 are formed after depositing a first metal layer 160 on the entire surface of the backside 115 of the wafer 110. Then, as shown in FIG. 4b, small groves 164 are formed in predetermined locations on the backside 115 of the wafer 110. The small groves 164 may be formed using a cutting blade having a width narrower than that used in the wafer sawing process. Next, as shown in FIG. 4c, trenches 166 of desired sizes are formed by wet-etching the small groves 164 using the first metal layer 160 as a mask.

Figure 4D:
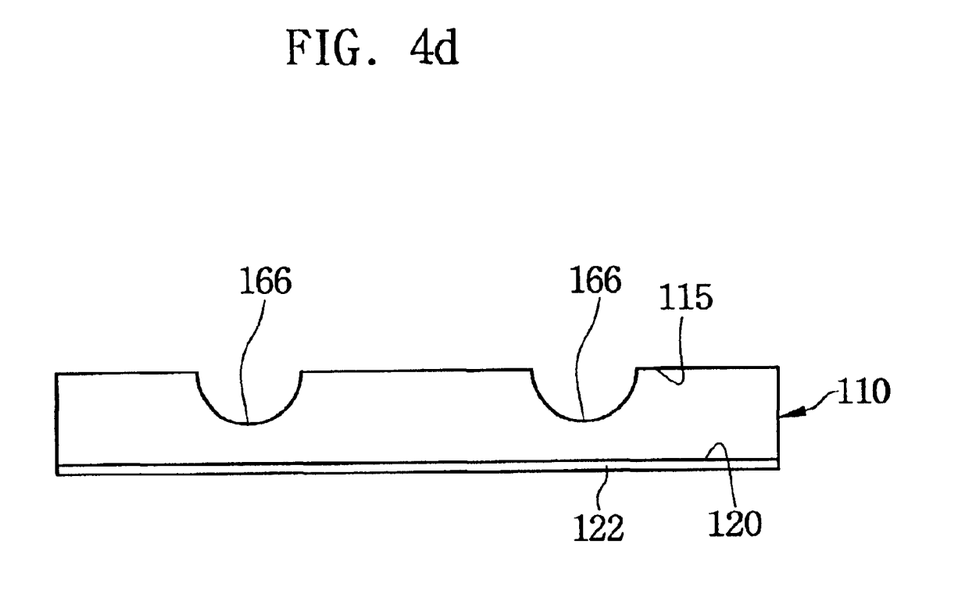
Figure 4E:
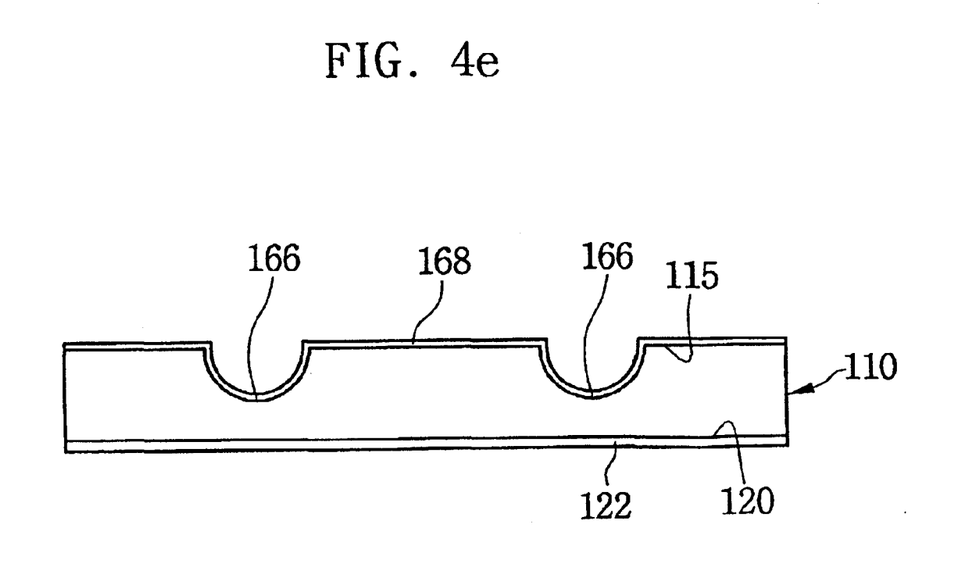

The first metal layer 160 is then removed, as shown in FIG. 4d, and a second metal layer 168 is deposited on the entire surface of the backside 115 of the wafer 110 including the trenches 166. The second metal layer 168 prevents the wafer 110 from breaking or generating chip cracks in the wafer sawing process, as does the metal layer 132 shown in FIGS. 3a to 3e.

FIGS. 5a to 5f are cross-sectional side views used to explain a third exemplary method of manufacturing the upper semiconductor chip having backside trenches according to the present invention.

Figure 5A:
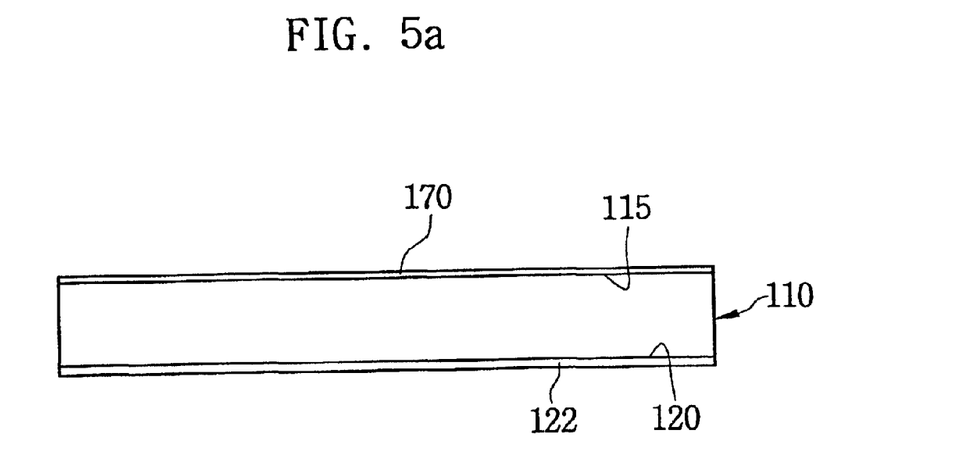
FIGS. 5a to 5f are used to explain a third method of manufacturing an upper semiconductor chip in a stacked chip package according to the present invention.
Figure 5B:
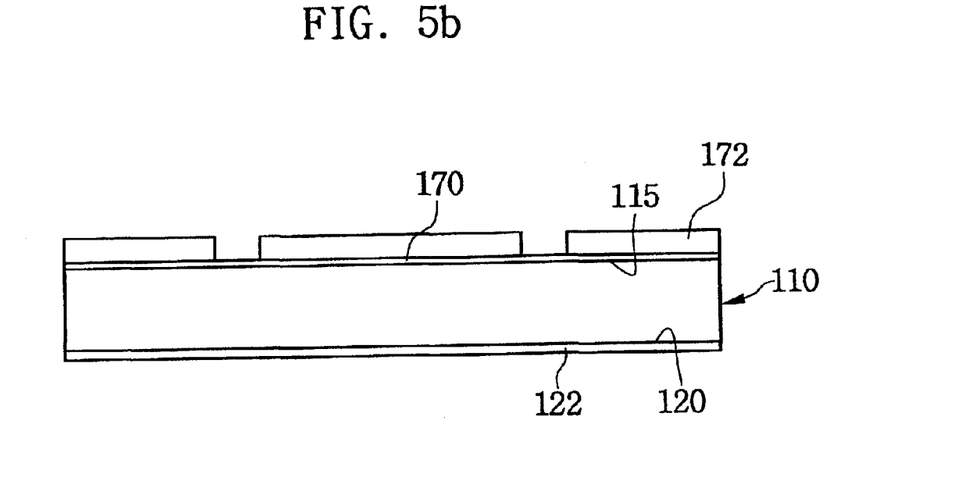

Referring to FIG. 5a, an etching mask layer 170 is deposited on the entire surface of the backside 115 of the wafer 110. A photo-resist pattern layer 172, as shown in FIG. 5b, is formed on the backside 115 of the wafer 110 by applying a photo-resist over the etching mask layer 170 and the patterning the photo-resist.

Figure 5C:
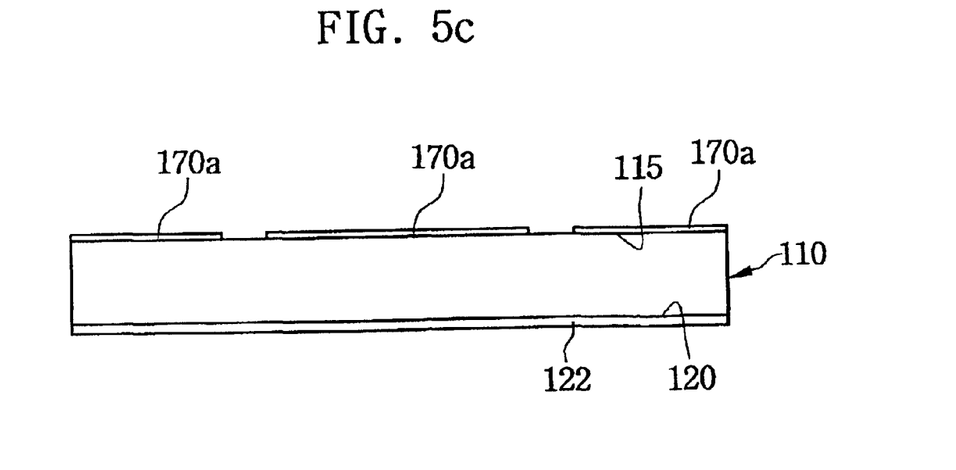
Figure 5D:
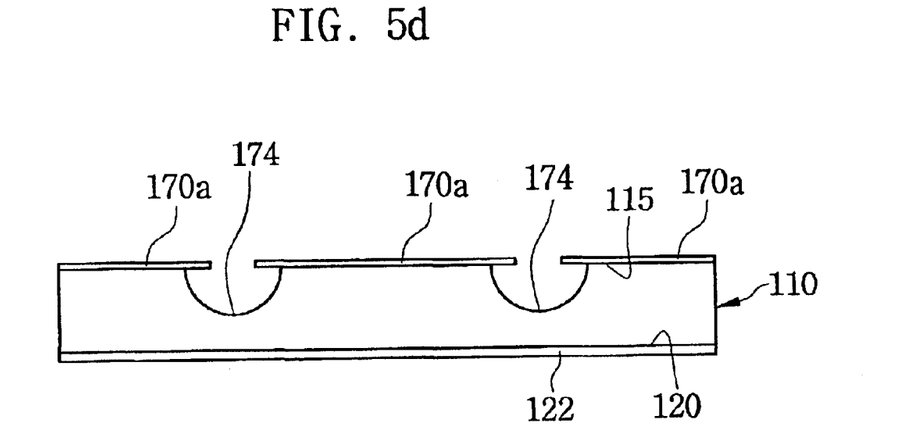

Next, an etching mask pattern layer 170a, as shown in FIG. 5c, is formed by removing the exposed etching mask layer 170 not covered by the photo-resist pattern layer 172 and removing the photo-resist pattern layer 172. As shown in FIG. 5d, trenches 174 are then formed by etching the backside of the wafer using the etching mask pattern layer 170a as a mask.

Figure 5E:
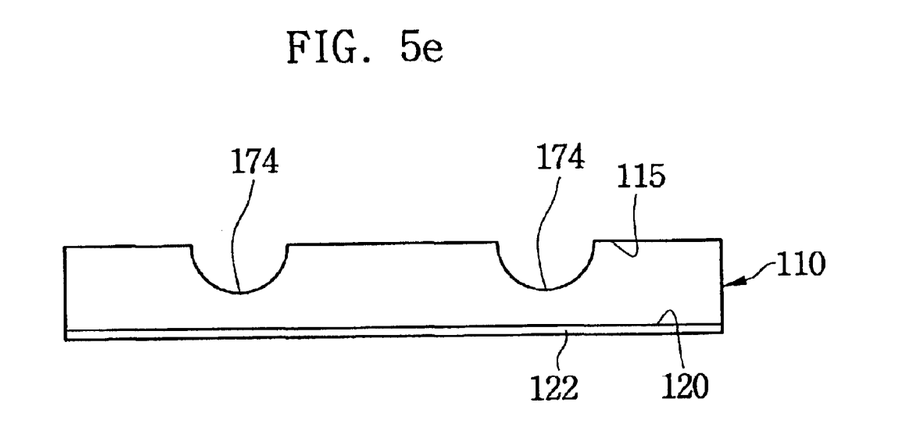
Figure 5F:
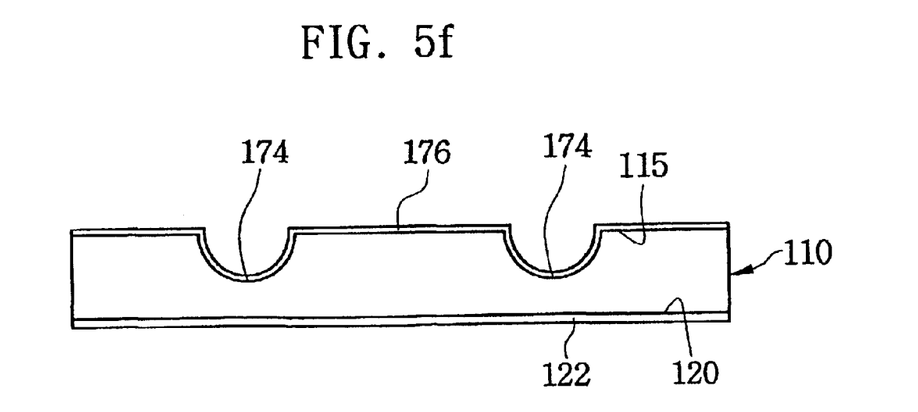

The etching mask pattern layer 170a is removed, as shown in FIG. 5e, and a metal layer 176 is deposited on the entire surface of the backside 115 of the wafer 110 including the trenches 174, as shown in FIG. 5f. The metal layer 176 prevents the wafer 110 from breaking or generating chip cracks in the wafer sawing process, as do the metal layers 132 and 168 shown in FIGS. 3a to 3e and FIGS. 4a to 4e, respectively.

One advantage of the present invention is that it allows chips having the same sizes to be stacked upon one another in a stacked chip package. Another advantage of the present invention is that it allows conventional wire-bonding technology/equipment to be used to electrically connect stacked chips having the same size to a substrate since the upper chip includes trenches. As a result, stacked chip packages can be manufactured using conventional equipment and thus at a lower cost. Yet another advantage of the present invention is that because the chips are stacked on only one surface of the substrate, sufficient space remains for external electrical connections on the bottom of the package.

While particular embodiments of the present invention have been shown and described, it will be apparent to those skilled in the art that changes and modifications may be made without departing from this invention in its broader aspect and, therefore, the appended claims are to encompass within their scope all such changes and modifications as fall within the true spirit of this invention.

What is claimed is:

1. A stacked chip package comprising:
   a substrate having a mounting surface which includes a plurality of bonding pads;
   a first semiconductor chip disposed over the mounting surface of the substrate, the first semiconductor chip having an active surface that includes a plurality of first electrode pads;
   a second semiconductor chip disposed over the active surface of the first semiconductor chip, the second semiconductor chip having an active surface that includes a plurality of second electrode pads;
   a plurality of first bonding wires that electrically connect the first electrode pads of the first semiconductor chip to the bonding pads of the substrate; and
   a plurality of second bonding wires that electrically connect the second electrode pads of the second semiconductor chip to the bonding pads of the substrate;
   wherein the second semiconductor chip includes trenches formed on a lower surface opposite to the active surface of the second semiconductor chip, wherein the trenches provide a space that allows the plurality of first bonding wires to be electrically connected to the plurality of first electrode pads of the first semiconductor chip and further wherein a metal layer is deposited on the entire lower surface of the second semiconductor chip.

2. The stacked chip package of claim 1 wherein the first semiconductor chip and the second semiconductor chip are of the same physical size.

3. The stacked chip package of claim 1 wherein the metal layer on the lower surface of the second semiconductor chip is attached to the active surface of the first semiconductor chip via an adhesive.

4. The stacked chip package of claim 1 further comprising a packaging body encapsulating the first and second semiconductor chips, the first bonding wires, the second bonding wires, and the bonding pads of the substrate.

5. The stacked chip package of claim 1 wherein a plurality of solder balls are formed on a lower surface of the substrate and the solder balls are electrically connected to the bonding pads of the substrate.

6. The stacked chip package of claim 1 wherein the substrate is selected from a group consisting of a polyimide tape, a printed circuit board (PCB), and a ceramic substrate.

7. The stacked chip package of claim 1 wherein the trenches have an arcuate shape.

8. The stacked chip package of claim 7 wherein the first semiconductor chip and the second semiconductor chip are of the same physical size.

9. The stacked chip package of claim 7 wherein the upper surface of the substrate includes a plurality of bonding pads that are electrically connected to the plurality of first electrode pads on the upper surface of the first semiconductor chip via a plurality of first bonding wires.

10. The stacked chip package of claim 7 wherein the upper surface of the substrate includes a plurality of bonding pads that are electrically connected to a plurality of second electrode pads on the upper surface of the second semiconductor chip via a plurality of second bonding wires.

11. The stacked chip package of claim 7 wherein the upper surface of the substrate includes a plurality of bonding pads that are electrically connected to the plurality of first electrode pads on the upper surface of the first semiconductor chip via a plurality of first bonding wires and are electrically connected to a plurality of second electrode pads on the upper surface of the second semiconductor chip via a plurality of second bonding wires.

12. The stacked chip package of claim 7 wherein the trenches enable the plurality of first electrode pads on the upper surface of the first semiconductor chip to be electrically coupled to the upper surface of the substrate via a plurality of first bonding wires.

* * * * *